United States Patent
Trimberger

(10) Patent No.: US 7,199,608 B1
(45) Date of Patent: Apr. 3, 2007

(54) PROGRAMMABLE LOGIC DEVICE AND METHOD OF CONFIGURATION

(75) Inventor: Stephen M. Trimberger, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 193 days.

(21) Appl. No.: 11/060,032

(22) Filed: Feb. 17, 2005

(51) Int. Cl.
H03K 19/173 (2006.01)

(52) U.S. Cl. .............................. 326/38; 326/41; 713/2

(58) Field of Classification Search ............ 326/37–41; 713/1, 2
See application file for complete search history.

(56) References Cited

U.S. PATENT DOCUMENTS

| | | | |
|---|---|---|---|
| 6,028,445 A | 2/2000 | Lawman | |
| 6,184,712 B1 | 2/2001 | Wittig et al. | |
| 6,222,757 B1 | 4/2001 | Rau et al. | |
| 6,324,676 B1 | 11/2001 | Burnham et al. | |
| 6,346,825 B1 | 2/2002 | Pang et al. | |
| 6,658,564 B1 * | 12/2003 | Smith et al. | 713/100 |
| 7,032,106 B2 * | 4/2006 | Horanzy et al. | 713/2 |
| 2003/0126424 A1 * | 7/2003 | Horanzy et al. | 713/2 |
| 2004/0178819 A1 | 9/2004 | New | |
| 2006/0038586 A1 * | 2/2006 | Xia et al. | 326/39 |

OTHER PUBLICATIONS

U.S. Appl. No. 10/956,989, filed Oct. 1, 2004, Sundararajan et al.
U.S. Appl. No. 10/956,884, filed Oct. 1, 2004, Sundararajan et al.

* cited by examiner

Primary Examiner—Don Le
(74) Attorney, Agent, or Firm—Walter D. Fields

(57) ABSTRACT

In configuring a programmable logic device, first configurable resources of the programmable logic device may be configured as a boot-strap configurator dependent on data in a first portion of configuration memory. After configuring the first configurable resources, data previously stored in a buffer of the programmable logic device may be retrieved to overwrite at least a portion of the configuration memory associated with the boot-strap configurator.

20 Claims, 9 Drawing Sheets

PROGRAMMABLE LOGIC DEVICE AND METHOD OF CONFIGURATION

RELATED DATA

For purposes of disclosure, cross-reference is made to "Bootable Programmable Logic Device for Internal Decoding of Encoded Configuration Data", by Sundararajan et al., U.S. patent application Ser. No. 10/956,989, filed Oct. 1, 2004, and to "Bootable Programmable Logic Device for Readback Encoding of Configuration Data", by Sundararajan et al., U.S. patent application Ser. No. 10/956,884, filed Oct. 1, 2004, the disclosures of which are hereby incorporated by reference in their entirety.

FIELD OF THE INVENTION

The present disclosure is directed to programmable logic devices, such as field programmable gate arrays. More specifically, the present disclosure relates to systems and methods for the configuration of programmable logic devices.

BACKGROUND

Programmable logic devices (PLDs), such as field programmable gate arrays (FPGAs), may comprise user-programmable integrated circuits that can be programmed to implement user-defined logic circuits. At least some typical FPGA architectures (for example, a Virtex FPGA available from Xilinx, Inc. of San Jose, Calif.), may include an array of configurable logic blocks (CLBs), a programmable interconnect structure (PIP), programmable input/output blocks (IOBs), blocks of random access memory (BRAM), multipliers, digital signal processing (DSP) blocks, processors, clock managers, delay lock loops, and so forth. In many FPGAs the individual CLBs, PIPs, IOBs and the like may be associated with respective one or more configuration memory cells, the contents of which may determine how the associated resources are configured. To realize a particular user-defined circuit, configuration data may be loaded into the configuration memory cells and the resources, such as CLBs, PIPs, and IOBs, may be configured to realize particular circuit components for the user's circuit as defined by the configuration data.

Due to advancing semiconductor technology, the complexity of these types of devices has greatly increased. For example, programmable devices (PLDs) such as field programmable gate arrays (FPGAs) are now incorporating ever increasing numbers of functional blocks and more flexible interconnect structures to provide greater functionality and flexibility. With the increased number of resources, an ever-increasing amount of configuration memory and data to be stored in the configuration memory may be required to control multiplexers that connect signals to various destinations. Accordingly, one design consideration for PLDs may be the length of time to be consumed by the PLD configuration process. For example, depending on a variety of design considerations, it may be advantageous for configuration to be performed in a minimal amount of time, requiring greater bandwidth to transmit the configuration data. Such PLD users may thus require a configuration mode with high bandwidth capability that may interface to a specific, perhaps proprietary, bus standard.

PLDs typically include dedicated configuration circuitry implementing a limited number of standard configuration modes (e.g., serial, parallel, master, master-serial, etc.). These standard configuration modes are limited to those that the PLD manufacturer deemed useful and cost-effective to put on every PLD. However, these standard configuration modes might not meet the system requirements for a specific user, as described above. Lending flexibility to the standard configuration modes, some PLDs called self-reconfigurable PLDs may include an ability to reconfigure themselves. Thus, these PLDs can be initially programmed to implement a custom configuration mode, such as configuration over a soft PCI bus, configuration from a multi-gigabit transceiver (MGT), decompression of configuration data while configuring, decrypting configuration data while configuring, and so forth. When reconfiguring, however, a portion of the logic used to perform the configuration has typically required dedication to configuration of the PLD. In other words, the resources of such portion are not able to be overwritten without affecting the ability to configure the PLD, thereby limiting the ability to reconfigure the PLD. Accordingly, these portions of the configuration logic typically have not been subsequently available for alternative user-defined applications.

Thus, a typical design consideration for custom configuration logic in self-reconfiguring PLDs has been the amount and/or type of device resources needed for a particular PLD configuration mode. While one configuration mode may enable efficient configuration, the resources required therefor might not then be available to implement a particular user-defined circuit. If these resources are high value resources, the dedication to configuration may seem costly. PLD users may wish to avoid implementing such custom configuration modes in preference of lower cost solutions.

Thus, typical self-reconfigurable PLD embodiments show a compromise in the number of different available configuration modes that may be available relative to the extent and costs that may be associated with dedicating a number of resources of the PLD to configuration.

In designing a particular PLD, therefore, one or more of these considerations, such as time for configuration, flexibility in selection of configuration modes, security of configuration, number of resources available for application designs and the like, may be important. Flexibility for accommodating such considerations may benefit efficiencies and functionality of PLDs.

SUMMARY

In one embodiment of the present invention, a method of configuring a programmable logic device (PLD) may comprise configuring first configurable resources of the PLD as a boot-strap configurator based on first data in a first portion of configuration memory. Replacement data may be stored in the PLD. The replacement data may be retrieved and used to overwrite at least part of the first portion of the configuration memory.

In another embodiment, a computer-readable medium may have instructions operable to perform, when executed by a controller and/or a processor of a PLD, a boot-up configuration method. In the method, first data may be loaded into a first portion of configuration memory for configuring a boot-strap configurator. Replacement data may be loaded into buffer of the PLD and second data may be loaded into a second portion of the configuration memory. At least part of the first portion of configuration memory may be overwritten with a portion of the replacement data from the buffer.

BRIEF DESCRIPTION OF THE DRAWINGS

Embodiments and features of the present invention will become more apparent from the detailed description and the appended claims, with reference to the accompanying drawings, in which:

DETAILED DESCRIPTION

Figure 1:
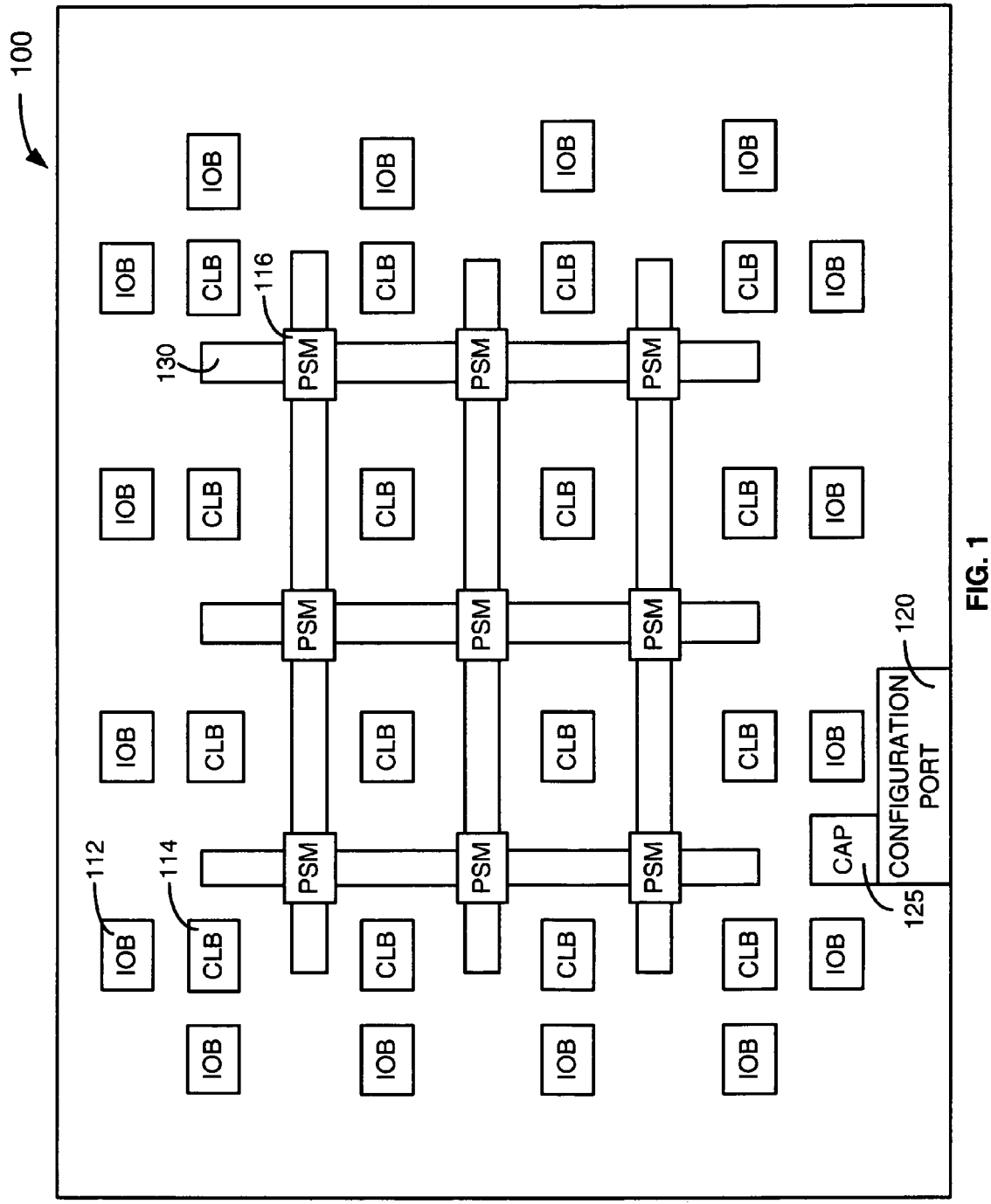
FIG. 1 is a simplified block diagram of a programmable logic device showing a particular architecture, useful for gaining an understanding of certain embodiments of the present invention.

In the following description, numerous specific details may be set forth to provide an understanding of exemplary embodiments of the present invention. It will be understood, however, that alternative embodiments may comprise subcombinations of the disclosed examples.

Additionally, readily established circuits and procedures of exemplary embodiments may be disclosed in simplified form (e.g., simplified block diagram and/or simplified description) to avoid obscuring an understanding of the embodiments with excessive detail. Likewise, to aid a clear and precise disclosure, description of known processes or devices—for example, random access memory, read-only memory, processor, state machine, programmable logic blocks, ports—may similarly be simplified where persons of ordinary skill in this art can readily understand their structure and operations by way of the present drawings and disclosure.

Further, the terms "data" or "configuration data" may at times be used, for example, to refer to data values, address or memory offset data, configuration logic, processor or programming instructions, control data or one or more of the above or other similar concepts. As used in this disclosure, unless the context indicates otherwise, the terms "configuration data" or "data" may be used in a broad sense to include at least both instructions (e.g., logic, control data) and data acted upon by instructions (e.g., values, addresses, etc.). The meaning for the terms data or configuration data will be apparent to those of ordinary skill in this art based on the context in which the terms are used.

In the following discussion, depending upon the context, the term processor may be understood to reference a microprocessor, embedded microprocessor (which may be a soft or hard processor), controller, sequencer, finite state machine, dedicated hardwired logic, or other operable logic of an integrated circuit or other similar device.

A programmable logic device (PLD), such as a field programmable gate array (FPGA), may, in some typical examples, be a general-purpose programmable device configurable by an end user to realize a desired user-specific and/or user-defined circuit (e.g., a circuit implementing a user-desired application, a circuit realizing a particular application or set of applications, etc.). The basic architecture of a given PLD may comprise an array of configurable (e.g., programmable) logic blocks (CLBs), a programmable interconnect structure, which may comprise a plurality of programmable interconnect points (PIPs) and configurable input/output blocks (IOBs). In some embodiments, a PLD may include other programmable and non-programmable resources such as memories, adders, multipliers, processors, transceivers, etc.

A given IOB may be configurable as an output buffer, an input buffer, or a bidirectional buffer. CLBs may be configurable to perform one of many logic functions. For example, CLBs of a particular PLD may be configured to realize combinational logic elements, sequential logic elements, function lookup tables, and/or control multiplexers. PIPs may be configured to provide desired routing between/among particular IOBs, CLBs, and/or IOBs. In general, a given PIP may act as a programmable switch-type element that may allow implementation of at least a portion of a particular route.

To realize a desired user-specific circuit, a user may design a circuit that may incorporate circuitry of multiple configured CLBs and multiple configured IOBs. To configure the programmable resources of the programmable logic device for the desired-specific circuit, predetermined configuration data may be loaded into configuration memory. The transfer of the configuration data into the configuration memory for configuring the user-specified circuit may be managed by a boot-up configurator. Typically, the boot-up configurator may be defined at least in part by an on-chip logic/processor, e.g., such as an on-chip controller, embedded microprocessor, soft processor, finite state machine, memory controller, or the like. In some embodiments, specific logic resources such as a Power PC, a microprocessor developed by International Business Machines (IBM), or MicroBlaze, a soft processor core of Xilinx Inc. may be incorporated into particular selected configuration modes to manage or control the configuration sequence.

When configuring a programmable logic device, the configuration data may be channeled by various avenues. For example, depending upon the particular configuration mode selected, the data may be loaded serially, in parallel, via master mode, in master serial mode, using boundary scan, etc. Further, a number of different resource options may be desired from which to select for the routing and sourcing of the configuration data. Some of the possible routing and sourcing options might include, e.g., routing via a PCI bus, routing via a multi-gigabit transceiver, sourcing from external read-only memory, sourcing from internal read-only memory, JTAG, etc. Accordingly, it may be understood that the selection of possible configuration modes and/or options may require preliminary data for designating the configuration and operation of the boot-strap configurator. This preliminary portion of the configuration data for configuring a boot-strap configurator may be referred to as boot-strap configuration data.

In one embodiment, therefore, a preliminary boot-up procedure may configure resources for the boot-strap configurator for implementing given select configuration modes and options based on the boot-strap configuration data.

Depending upon the designated configuration mode and associated options, the data for configuring the boot-strap configurator may be derived from an internal source or an external source or a combination of both. An example of an internal source may include, e.g., an internal read-only memory (ROM) or a flash memory. For such internal devices, the data may be initially programmed into the memory during product manufacture. In the field, during use of the PLD, the configuration data may then be transferred into configuration memory during a device boot-up, reset, or reconfiguration procedure. An example of an external source may include, e.g., JTAG, external read-only memory, an external loading device, etc. Regardless of whether configuration data for the boot-strap configurator is derived from an internal or an external source, the programmable logic device may be understood to realize a particular configuration mode/option/protocol based on predetermined boot-strap configuration data.

The amount of device memory and on-chip resources to be employed for implementing the configurator may depend on the particular configuration mode selected for the boot-strap configurator. For example, a given amount of configuration memory is needed to store the data designating the logic of the boot-strap configurator. Further, a processor might also be configured per some of the configuration data so that it may assist device configuration.

To reclaim the memory and resources used to store and run the boot-strap configurator, in accordance with an embodiment of the present invention, these initial portions of the configuration memory may be overwritten, e.g., to replace, update or reallocate the resources for the configurator by writing over other previously stored data. This overwriting of the configuration memory associated with the boot-strap configurator may be performed according to various embodiments of the present invention.

By such embodiments, therefore, a given programmable logic device (e.g., an FPGA) may support a plurality of selectable configuration modes without suffering the more customary flexibility/cost compromise associated with the typical solutions that required resource dedication to configuration. In some cases, successive programmable logic device families may be readily accommodated via embodiments of the present invention for enabling seemingly seamless operability and compatibility for previously known configuration modes (called "legacy configuration modes") of prior families. Further, given the flexibility afforded by embodiments of the present invention, new configuration modes might also be developed during the life of a given family and yet be capable of ready implementation.

Referencing FIG. 1, a programmable logic device 100 may comprise user-programmable logic such as IOBs 112, CLBs 114, and a programmable interconnect 130, which may comprise programmable switch matrices (PSMs) 116 and other programmable interconnection points (PIPs, and the like). The respective IOBs 112 and CLBs 114 may be configurable (via configuration port 120) to perform a variety of functions. Programmable interconnect 130 may also be configurable (e.g., programmable) to provide electrical connections between the various CLBs 114 and IOBs 116 by configuring the PSMs, PIPs and perhaps other logic structures through configuration port 120. As noted above, in some embodiments, a programmable logic device may include various other resources.

In one example of the programmable logic device 100, further referencing FIG. 1, configuration port 120 may interface an external boundary of the logic device to assist transfer of data to/from the programmable logic device. In further examples, programmable logic device 100 may also comprise dedicated internal logic configurable by a user to perform specific functions internal the device. Examples of such other uses may include clock nets (not shown), power distribution grids (not shown), and boundary scan logic (e.g., IEEE Boundary Scan Standard 1149.1, not shown).

Further referencing FIG. 1, while various examples of a PLD may be described with just a few resources, e.g., 16 CLBs, 16 IOBs, and 9 PSMs logic blocks, for purposes of clarity; it will be understood, however, that such programmable logic devices might also contain thousands of CLBS, thousands of IOBs, and thousands of PSMs and other configurable cores. Further, the ratio of the number of CLBs, IOBs, and PSMs can also vary.

In a particular embodiment for programmable logic device 100, further referencing FIG. 1, at least a portion of the device configuration memory may be disposed among the various programmable components of the programmable logic device (e.g., CLBs, IOBs, PSMs, PIPs, etc.). That is, a particular resource may have its own localized associated portion of the configuration memory. Further resources may have their configuration memory defined by portions of block random access memories (BRAM or block RAM), which may be disposed more remotely from the particular programmable components.

Figure 2:
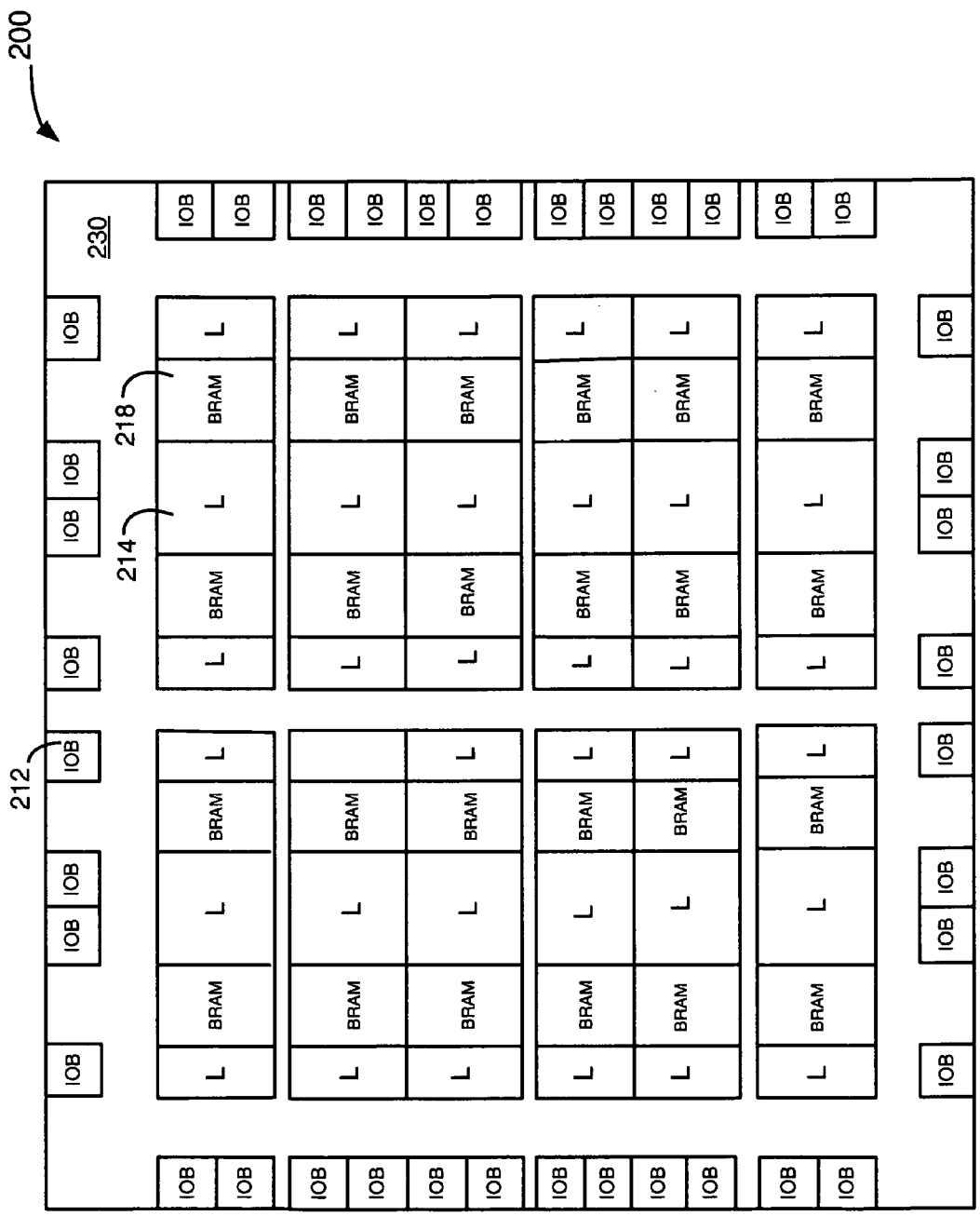
FIG. 2 is a simplified block diagram of a programmable logic device showing a particular architecture comprising block random access memories, useful for gaining an understanding of certain embodiments of the present invention.

Referencing FIG. 2, provisions for the configuration memory, such as a random access memory block BRAM 218, may be located in proximity to respective blocks or groups of programmable blocks of IOBs 212, CLBs 214, etc. Generally, programmable interconnect circuitry 230 may also be understood to programmably associate the BRAM 218 to nearby logic (e.g., CLBs 214, IOBs 212, etc.). In some cases, such interconnect may have standardized connections to and from corresponding elements of adjacent blocks. It may also include connections to and from the programmable logic elements within same given blocks.

When represented schematically, the BRAMs may be shown with domains encompassing four CLBs. In other particular programmable logic devices, the BRAMs may be realized for association with alternative domains or extents. For example, the BRAMs may be arranged within some architectures to extend with associations that extend along columns of the programmable logic device. This columnar association might also map to a respective column within an array of CLBs. In addition, a column of BRAM might also be separated from a neighboring BRAM column by a plurality of columns of CLBs, wherein a substantial number of user-programmable logic resources may be disposed between the neighboring columns of block RAM.

Particular embodiments of the present invention, therefore, may organize the sequence of data writes associated with overwriting and reclaiming resources of the boot-strap configurator so as to leverage the mapping of the BRAM and configuration memories relative to the overall device architecture. For example, if a boot-strap configurator may be realized using resources organized within a single column of the array of CLBs, then data for the overwriting and reconfiguration of the resources may be managed within, perhaps, a similar single column of the memory architecture associated with the PLD.

In some embodiments of the present invention, an embedded processor of a PLD may be incorporated into the boot-strap configurator, which may ease device configuration and accommodate a broad variety of different configuration modes. Such embodiment may lend flexibility to the configurator realizations in part because the embedded processor may accept software instructions by which it may execute variously tailored configuration procedures. Further, such processor/software logic solution for the configurator may reduce the amount of resources that might otherwise be required if it were to be realized per an alternative logic realization.

Figure 3:
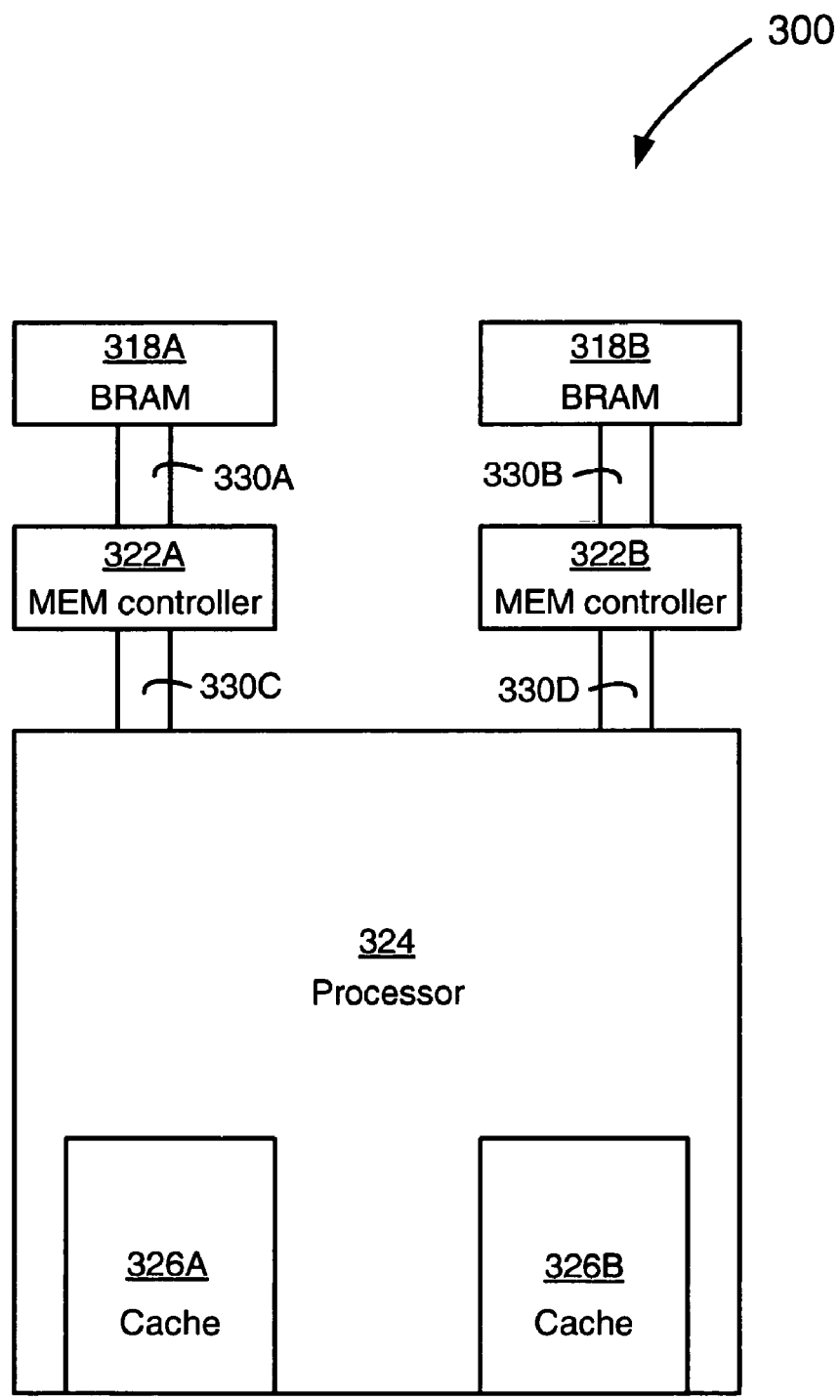
FIG. 3 is a simplified block diagram of a portion of a programmable logic device showing an embedded microprocessor and block random access memory, useful for gaining an understanding of certain embodiments of the present invention.

Referencing FIG. 3, an embedded microprocessor 324 (e.g., Power PC by IBM) may comprise on-chip cache 326A, 326B. One of the on-chip caches (e.g., 326A) may comprise a data cache, and another of the on-chip caches (e.g., 326B) may comprise an instruction cache. Processor 324 may further be electrically coupled to block RAM 318A, 318B through memory controllers 322A, 322B. Block RAM 318A, 318B may be coupled to controllers 322A, 322B via interconnects 330A, 330B, respectively. The controllers 322A, 322B, in turn, may be coupled to the processor 324 via interconnects 330C, 330D.

The processor may be operable to perform various functions as may be called for by a sequence of instructions in its instruction cache. Such functions may comprise, e.g., decompressing, decoding, decrypting, interpreting, addressing, calculating, performing algorithms, etc. For some embodiments, processor 324 may be designed with sufficient capacity for data cache memory 326A and instruction cache 326B (e.g., for data values, logic, instructions) to enable performance of a particular task internally without need to fetch data from other remote memory such as block RAMs 318A, 318B or other configuration memory. That is, processor 324 may be capable of performing some tasks while working completely within its own internal cache 326A, 326B resources.

Some embodiments may employ such processor within a boot-strap configurator so as to take advantage of its ability to perform at least some tasks internally within itself and via its own internal cache.

A boot-strap configurator realization using such an embedded microprocessor may further allow the programmable logic device to minimize incorporation of other resources. Accordingly, the number of resources (e.g., memory, logic, datapaths) required by such configurator embodiment, and likewise the amount of data required for reconfiguration, might, therefore, be less than that which might otherwise be required for the alternative hardware logic realizations. Further, if the amount of reconfiguration data needed to overwrite and reconfigure these resources may be sufficiently reduced, for some embodiments, the cache resources available on-board the processor and/or PLD may be sufficient for buffering the reconfiguration data.

Figure 4:
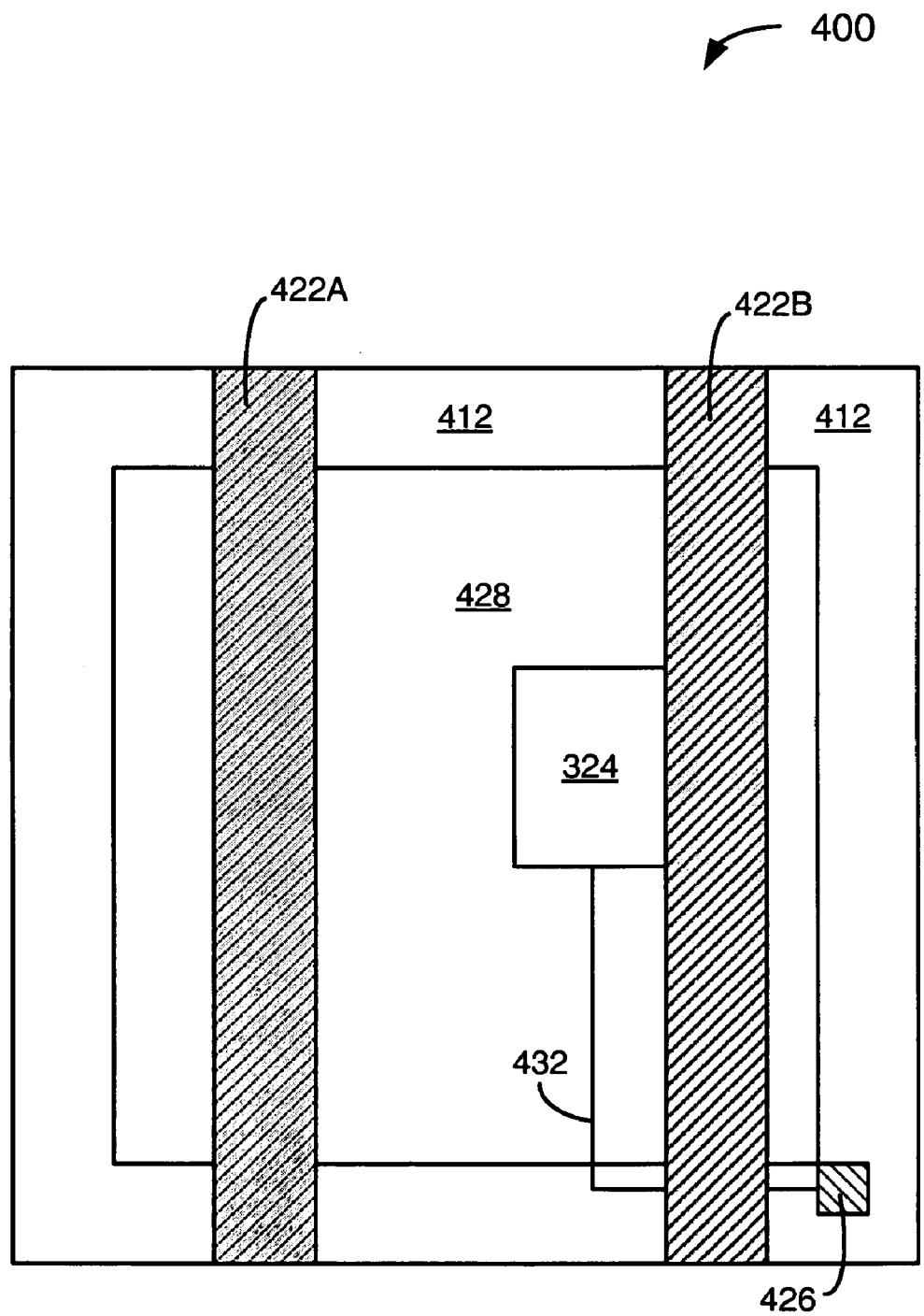
FIG. 4 is a simplified block diagram of a programmable logic device showing various components, including a processor, an internal configuration access port, and a datapath for coupling the processor to the access port, according to certain embodiments of the present invention.

Referencing FIG. 4, a programmable logic device 400 may comprise embedded processor 324, multi-gigabit transceivers, together with associated block RAMs 422A, 422B, configurable input/output ports 412, an array of configurable logic blocks 428 and programmable interconnects (not shown). The device 400 may further comprise an internal configuration access port (ICAP) 426, which may be configured to be accessible by configured user-defined logic.

By one embodiment, further referencing FIG. 4, these resources of programmable logic device 400 may be configured to form the boot-strap configurator with datapath 432 (e.g., wire, interconnect, etc.) between processor 324 and the internal configuration access port 426. The datapath 432 and ICAP 426 may thus serve as part of an interface to allow processor 324, or other device logic, or an external configuration device, access to program at least some of the configuration memory of device 400.

If the embedded processor is not located immediately adjacent the ICAP 426, then the amount of interfacing resources (e.g., programmable interconnects, PSMs, PIPs, etc.) required to configure a datapath 432 between the processor 324 and port 426 may extend across multiple data frames/blocks/portions of the configuration memory. Thus, by some embodiments, processor 324 may be disposed proximate the internal configuration access port 426 so that a limited number of programmable resources may be capable of interfacing the processor to ICAP 426. Likewise, the amount of reconfiguration data that would be required during reconfiguration may similarly be reduced.

Figure 5:
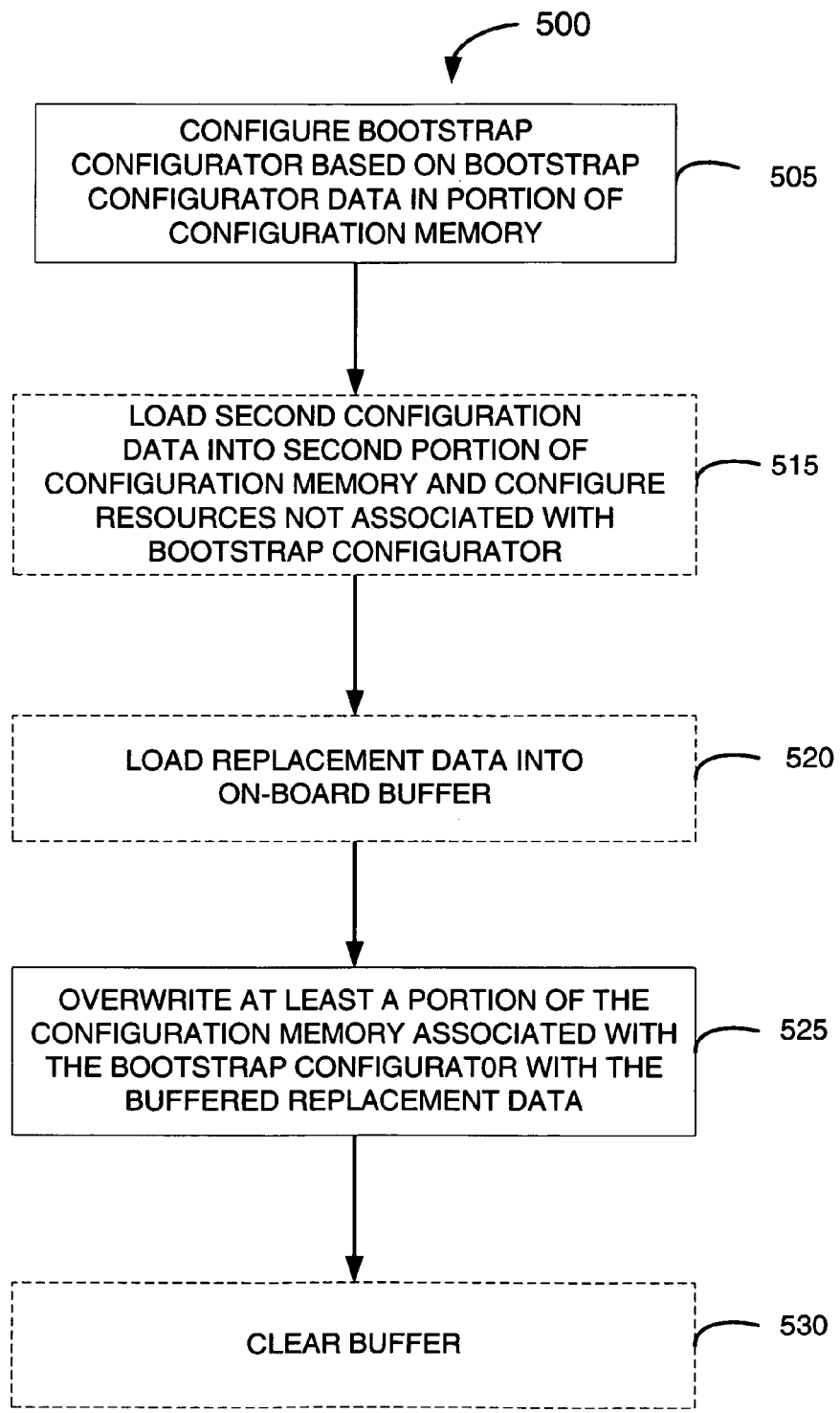
FIG. 5 is a simplified process flow diagram illustrating a method of configuring a programmable logic device, consistent with certain embodiments of the present invention, showing procedures for enabling the replacement of data associated with a boot-strap configurator.

In a method of configuration 500, referencing FIG. 5, a programmable logic device may power-up to configure (block 505 of FIG. 5) a boot-strap configurator by storing boot-strap configuration data in a first portion of the configuration memory. In a particular embodiment, the boot-strap configurator may be loaded from a standard configuration source such as an internal read-only memory or a flash memory. Alternatively, the boot-strap configurator may be configured based on boot-strap configuration data obtained from an external read-only memory, a JTAG (Joint Test Action Group of IEEE) interface, an external programming device, or other external programming source. In further embodiments, the boot-strap configuration data may be derived from both internal and external sources.

In a particular embodiment, a controller or processor of the boot-strap configurator may execute portions of the configuration data to operatively program programmable communication resources. In one example, it may form a datapath to interconnect or interface a processor with other device resources. It might also include logic for decoding or decrypting data received from an external source to recover, e.g., second configuration data. Such procedures could be performed by, for example, logic configured as a soft processor, finite state machine, sequencer, port, or other logic resource of the device. In a specific example, the boot-strap configurator may incorporate a multi-gigabit transceiver (MGT) or an I/O port (e.g., an IOB), which may assist processing of the data to recover the second configuration data.

The configuration of the boot-strap configurator may be defined by data stored in a first portion of the configuration memory of the programmable logic device. This first portion of the configuration memory may include, for example, portions of block RAM or memories embedded within configurable logic resources (CLBs, IOBs, etc.). Initially, it may be stored in non-volatile memory (e.g., read-only memory, flash memory, etc.), for subsequent transfer into the configuration memory during an initial phase of a boot-up configuration sequence.

In a further embodiment, an initial portion of the configurator's configuration data be derived from internal non-volatile memory operable to launch the boot-up sequence, while a further portion of the configurator's configuration data may be obtained subsequently to, e.g., embellish the boot-strap configurator for a given select configuration mode.

For example, an initial portion of the boot-up configuration data may initially configure and enable an external interface port, from which further configuration data may be obtained to further specify a particular mode or option of the boot-strap configurator, such as, e.g., routing via a PCI bus, incorporation of a MGT for high-speed serial-to-parallel interfacing, encoder/decoder processing, decryption, Internet Protocol, serial-scan. Thus, an unlimited variety of configuration modes and options may be available for the boot-strap configurator, such as configure over soft PCI, configure from multi-gigabit transceiver, and/or decompress while obtaining (block 515 of FIG. 5) configuration data for a given user-specified application or design.

The boot-strap configurator may further obtain (block 520 of FIG. 5) and buffer replacement data within the PLD. After configuring (block 515 of FIG. 5) other portions of the programmable logic device via the configured access port and/or processing logic/processor of the boot-strap configurator, the replacement data may then be transferred from the buffer within the PLD to the first portion of the configuration memory. This overwrite of the first portion of the configuration memory may be understood to reconfigure the resources of the boot-strap configurator (block 525 of FIG. 5). Accordingly, valuable configurable components of the boot-strap configurator, such as an embedded processor, MGT, or I/O port, might then be made available to user-defined applications.

Figure 6:
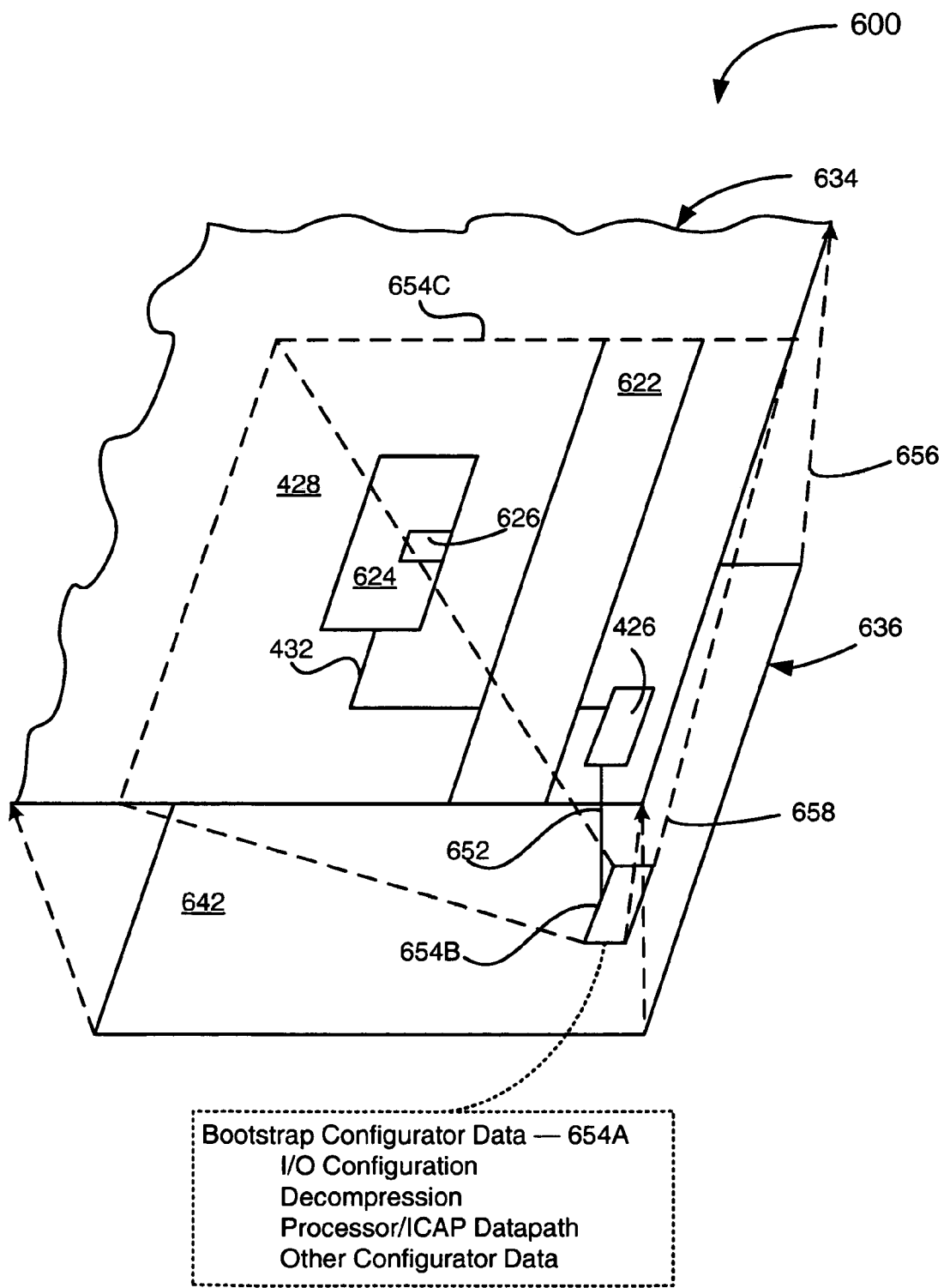
FIG. 6 is a conceptual, simplified block diagram, showing relationships between various resources of a programmable logic device, according to particular embodiments of the present invention.

In a particular embodiment, moving forward with reference to FIG. 6, a portion of the programmable resources of programmable logic device 600 may be configured to form boot-strap configurator 654C based on boot-strap configuration data 654A within a corresponding portion 654B of configuration memory 642. Such boot-strap configurator data 654A may include, e.g., provisions to configure input/output ports by which to obtain second configuration data. Other provisions of the configuration data 654A may relate to configuring programmable resources for enabling decompressing, decoding, decrypting, interpreting, or other processing of data operable to recover and load second configuration data. The boot-strap configurator data 654A may also include provisions related to configuring and/or programming a processor 624 and a data interface (432, 426, 652) between processor 624 and configuration memory 642. The above configuration is presented as merely an example of a boot-strap configurator. Those skilled in the art will recognize that a wide variety of device resources, instructions, or logic may be incorporated to receive, recover and load second configuration data for user-specified circuit applications. In this particular example, boot-strap configurator data 654A might further comprise software (such as a sequence of instructions) capable of being executed by a controller or processor of the boot-strap configurator, for performance of a portion of the boot-strap configuration sequence.

Further referencing FIG. 6, configuration memory 642, including the first portion 654B associated with the boot-strap configurator, may be accessible by way of (an address port, a data port and a control port, which may be within) control of the internal configuration access port 426. Further, given the internal accessibility of internal configuration access port 426, the configuration memory may be written from within the programmable logic device 600, including by way of the configured resources of the device such as by processor 624. Thus, it may be understood that port 426 may assist the loading of configuration data to program and configure and/or reconfigure the programmable resources of the programmable logic device 600. The internal configuration access port 426 may further be understood to comprise multiplexers and/or address decoders operable to select areas of the configuration memory 642 to receive the application design (e.g., second configuration data) as designated by the boot-strap configurator.

The logic plane 634 may comprise a portion of resources 654C to be configured as a boot-strap configurator to be operable to perform a boot-strap configuration sequence of a predefined configuration mode for loading second configuration data to a user-specified design to be configured within the programmable logic device. For example, in a particular embodiment, the programmed resources 654C for the boot-strap configurator may comprise input/output ports, processor logic, internal configuration access port 426, datapath 432, block RAM and associated multi-gigabit transceivers 622, and other user-configurable logic blocks 428. In another particular embodiment, these configurator resources for the boot-strap configurator might further comprise, depending upon the particular configuration mode and options selected, a finite state machine, a soft processor, dedicated hardware logic, or multiple internal configuration access ports.

Returning to reference FIG. 5, upon configuring the boot-strap configurator (block 505 of FIG. 5), second configuration data may be recovered and stored (block 515 of FIG. 5) into portions of the configuration memory other than those associated with the boot-strap configurator data. The loading of this second configuration data may be performed at least in part by the boot-strap configurator. This second configuration data may be described as perhaps comprising a first portion of user-defined data that does not interfere with the operation of the boot-strap configurator. A second portion might be understood to interfere with operation of the boot-strap configurator. For example, the boot-strap configurator may comprise elements operable to access an external source of configuration data, e.g., a PCI bus interface, a test port (e.g., Test Access Port (TAP)) coupled to a boundary-scan device (IEEE 1149.1, JTAG), a high-speed interface such as a multi-gigabit transceiver interface, etc., by which it may receive and recover the configuration data. Some of these same elements might then be desired for the final user-defined circuit. The data associated with reconfiguring these resources may be grouped within the second portion of the user-defined data.

In some embodiments the non-interfering first portions of the second configuration data may be immediately stored in the configuration memory 642, while the second portions of the user-defined configuration data might first be buffered in memory apart from the configuration memory. Such memory may be described as buffer memory and may comprise, e.g., block RAM or cache of an embedded processor.

In a particular embodiment, the buffer may comprise a specialized buffer memory that may be dedicated to storing the replacement configuration data. Additionally, "read" and "write" circuitry, such as a DMA controller, could be dedicated for assisting delayed transfer of the buffered replacement data to the configuration memory. Further, such transfers could be performed block-by-block or frame-by-frame until configuring each block/frame of the portions of the configuration memory associated with the boot-strap configurator is complete.

Further referencing FIG. 5, the transfer of the buffered reconfiguration data may be performed in different sets. For example, in a first phase of the procedure, a first set of replacement data may be retrieved from the buffer in which it is stored (e.g., block RAM, processor cache, dedicated replacement data buffer) and used to overwrite a portion of the boot-strap configurator that may no longer be needed for further performance of the boot-strap sequence. In a particular embodiment, the phase-one portion of the boot-strap configurator data to be overwritten may correspond to the resources related to, e.g., external input/output ports. In a further embodiment, the configured interface for receipt of the reconfiguration data may comprise a multi-gigabit transceiver, which resource might also be reconfigured during the phase-one portion of the boot-strap configurator overwrite, given that the configuration data has already been recovered. In another embodiment, the portion initially overwritten by the phase-one portion of the reconfiguration process may further comprise logic associated with decoding, decompressing, or decrypting of the received data for the recovery of the second configuration data.

In a second phase of the procedure to transfer the buffered replacement data and reconfigure remaining portions of the boot-strap configurator, consistent with a particular embodiment, at least a portion of this reconfiguration sequence may be performed by the processor running internally out its cache. The second-phase portions of the replacement data, for this embodiment, might then be retrieved from the processor's cache and transferred into the configuration memory under the control of the processor itself. As the last portion of the reconfiguration data (phase-two) is stored in the configuration memory, final provisions of the boot-strap configurator, such as those that may be used for the final reconfiguration operations of the boot-strap configurator—i.e., portions associated with transfer of the replacement data into the configuration memory—may then be reconfigured.

For example, in the event the boot-strap configurator uses an onboard or embedded processor (e.g., 324, FIG. 3), an essential portion of the boot-strap configurator may comprise the datapath (432, FIG. 6) that enables communication between the controller (e.g., 624, FIG. 6) and an internal configuration access port (426, FIG. 6). These elements may be deemed as the essential provisions to be dealt with by the phase-two portion of the replacement data transfer; once the interfacing datapath 432 is overwritten, the resources therefor are then reallocated to the user-specified circuit application and the boot-strap configurator may no longer be available to participate in further configuration or reconfiguration of the device.

In another embodiment, the essential provision of the configurator may comprise a soft processor, a finite state machine or other logic operable to perform some final provision of the configuration/reconfiguration.

In a particular example, further referencing FIG. 6, the processor may first issue instructions to overwrite the datapath 432 to the internal configuration access port 426. The internal configuration access port 426 may then communicate the overwrite instructions to the portions of the configuration memory associated with the datapath 432, whereupon these resources may be reprogrammed, eliminating the previously-configured datapath 432.

In another particular embodiment, the boot-strap configurator may load the reconfiguration data into the processor's cache. The processor may, therefore, work from its internal cache to perform the overwrite; after which, the contents of the cache may be deleted. In other words, following transfer of the replacement data, the processor 624 may operate to delete the replacement data that had been buffered within its cache.

In some embodiments, the configuration memory may be partitioned into multiple data frames. For this type of partitioning, overwriting of a single resource (e.g., interconnect) may comprise copying an entire frame of configuration data to a buffer, whereupon it may be transferred in its entirety to the respective frame partition of the configuration memory. For example, assuming a long datapath 432 between processor 624 and access port 426, multiple interconnect resources for the datapath may span across multiple frames of the configuration memory. Reconfiguration of this resource might, therefore, require buffering and transfer of data for all of the resources to each of the multiple data frames that may incorporate a part of the lengthy datapath.

Figure 7:
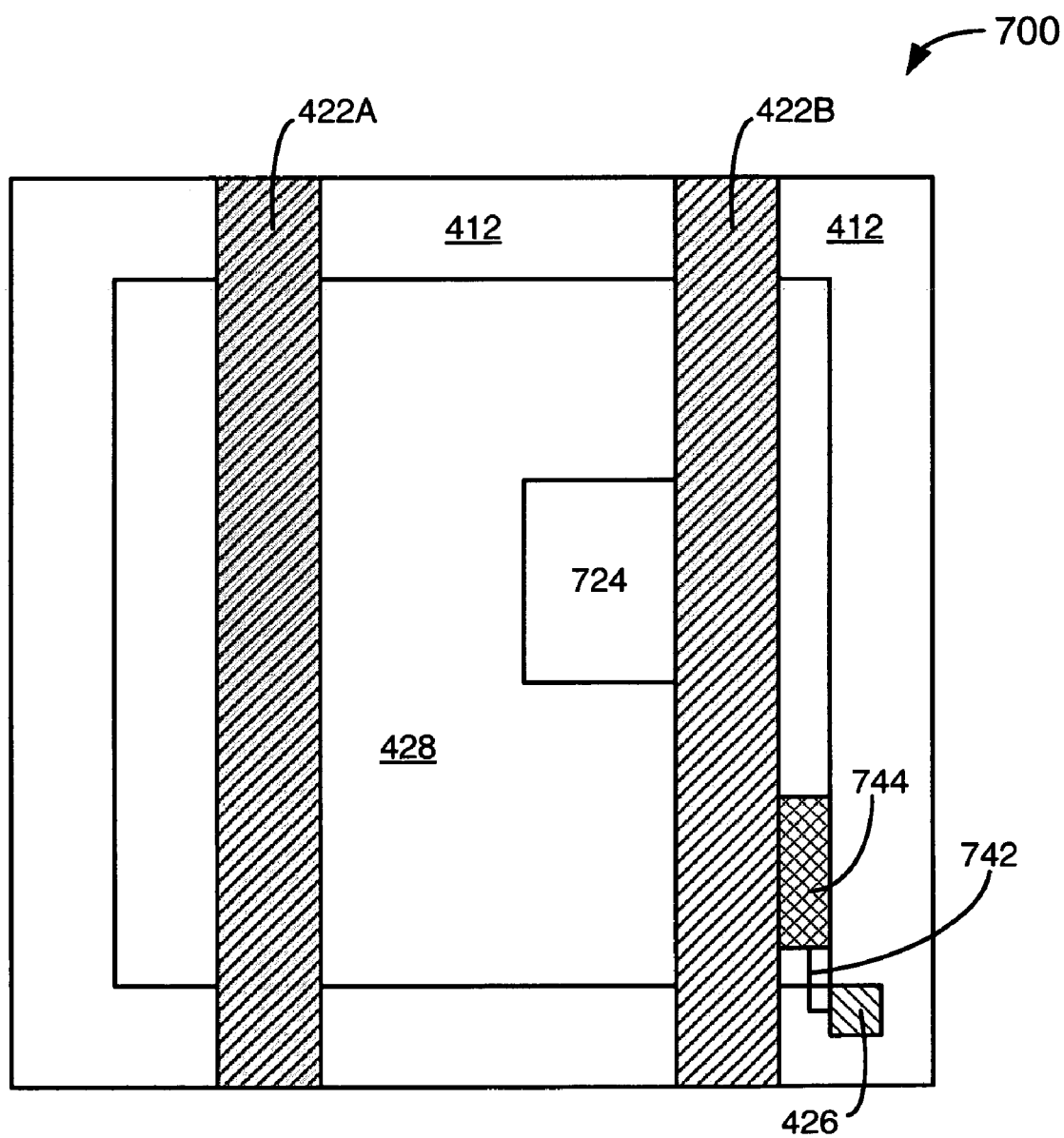
FIG. 7 is a simplified block diagram of a programmable logic device showing various components, including a soft processor, an internal configuration access port, and a datapath for coupling the soft processor and the port, according to particular embodiments of the present invention.

In some cases, therefore, a processor (soft processor) may be disposed more proximate the internal configuration access port 426 so that a shorter datapath may be used for interfacing between the processor and ICAP. Likewise, reconfiguration may be more easily accommodated using a relatively smaller amount of reconfiguration data. In one such embodiment, referencing FIG. 7, a programmable logic device 700 may comprise a soft controller 744 coupled to internal configuration access port 426 by way of a short datapath 742 (shorter than the datapath 432 described earlier relative to FIG. 4). The soft controller may comprise, for example, a MicroBlaze soft controller available from Xilinx Inc., as an embedded core. Comprising fewer interconnect resources, the short datapath 742 may be reconfigured by the buffering and transfer of just a few frames of configuration memory.

In a further embodiment, the overwriting of resources associated with processor datapaths and connections may be performed by dedicated hardware on the logic device. For example, the replacement data for reconfiguring routes to and from the processor may be stored in block RAM or in a lookup table (LUT). A simple sequencer (e.g., DMA unit) may then perform the overwrite by simple delayed transfer of the buffered replacement data to the configuration memory.

Returning with further reference to FIG. 5, in accordance with a further embodiment, after transferring the replacement data and reconfiguring the resources associated with the boot-strap configurator, the contents of the buffer memory may be cleared (block 530 of FIG. 5). For example, when the buffer memory is configured in a portion of block RAM (BRAM), the replacement data that has already been transferred may then be cleared by writing all of the designated locations of the BRAM with zeros (or other default value). In another particular embodiment, the clearing may be performed by deallocating the memory (e.g., freeing the memory) and/or reallocating it to other applications. Or, its contents may be cleared by simply changing the stored state for the memory, for example, changing a bit in its page table.

Figure 8:
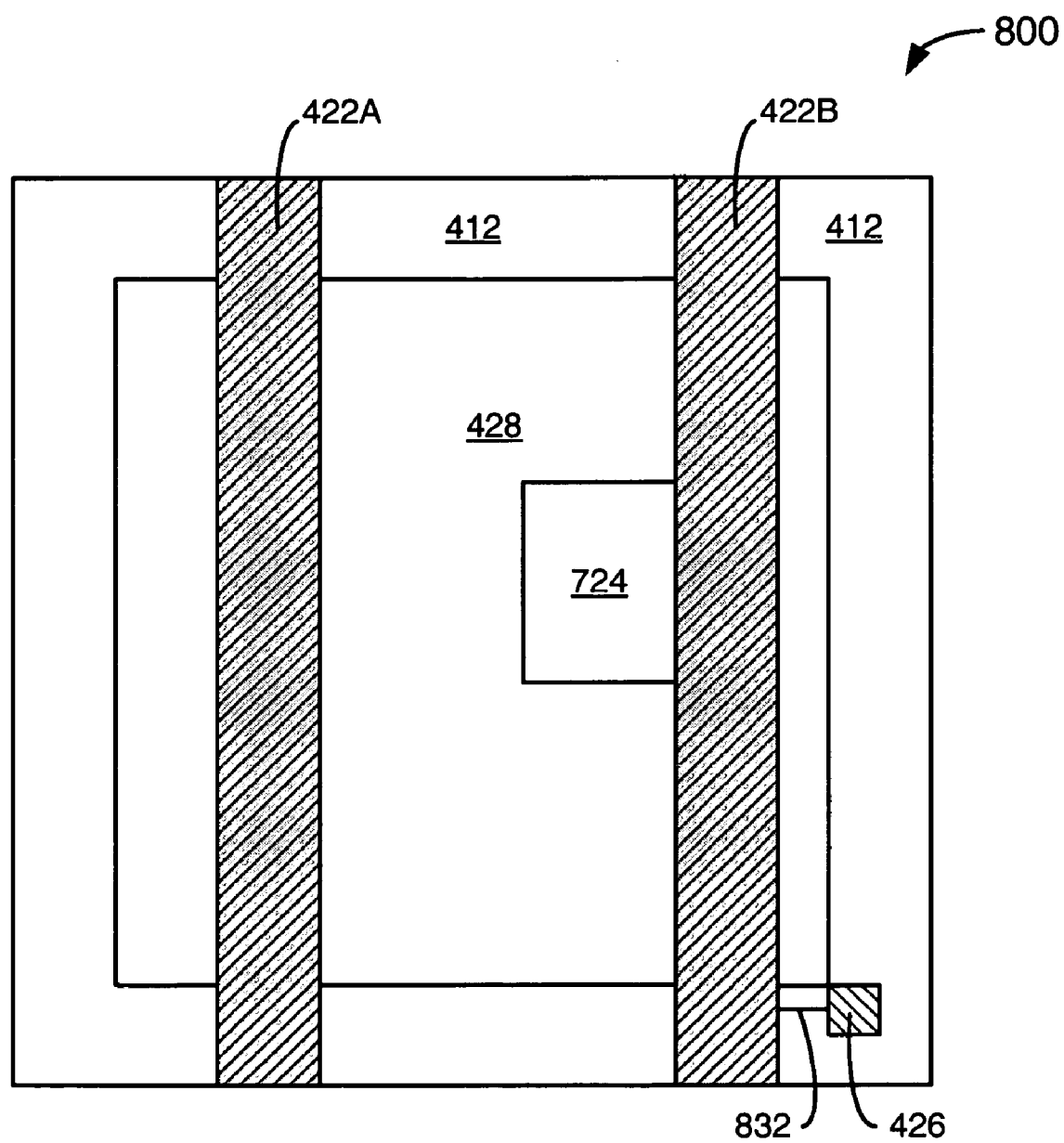
FIG. 8 is a simplified block diagram of a programmable logic device showing a particular architecture, with a plurality of distributed internal configuration access ports coupled to a controller, consistent with certain embodiments of the present invention.

Referencing FIG. 8, a programmable logic device 800 may be configured to realize a boot-strap configurator comprising an internal configuration access port 426 coupled to block RAM with MGT controller 422B by way of a programmable interconnect datapath 832, which may comprise a relatively short distance in comparison to the datapath 432 described previously herein with reference to FIG. 4. It may be understood, therefore, that the number of resources required to realize the short datapath may be few and that the number of frames required for the replacement configuration data may similarly be few. Accordingly, for such embodiment, the boot-strap configuration data (654B, FIG. 6) and the replacement configuration data may perhaps both be stored in a single block RAM, which may further simplify the transfer of data frames.

Figure 9:
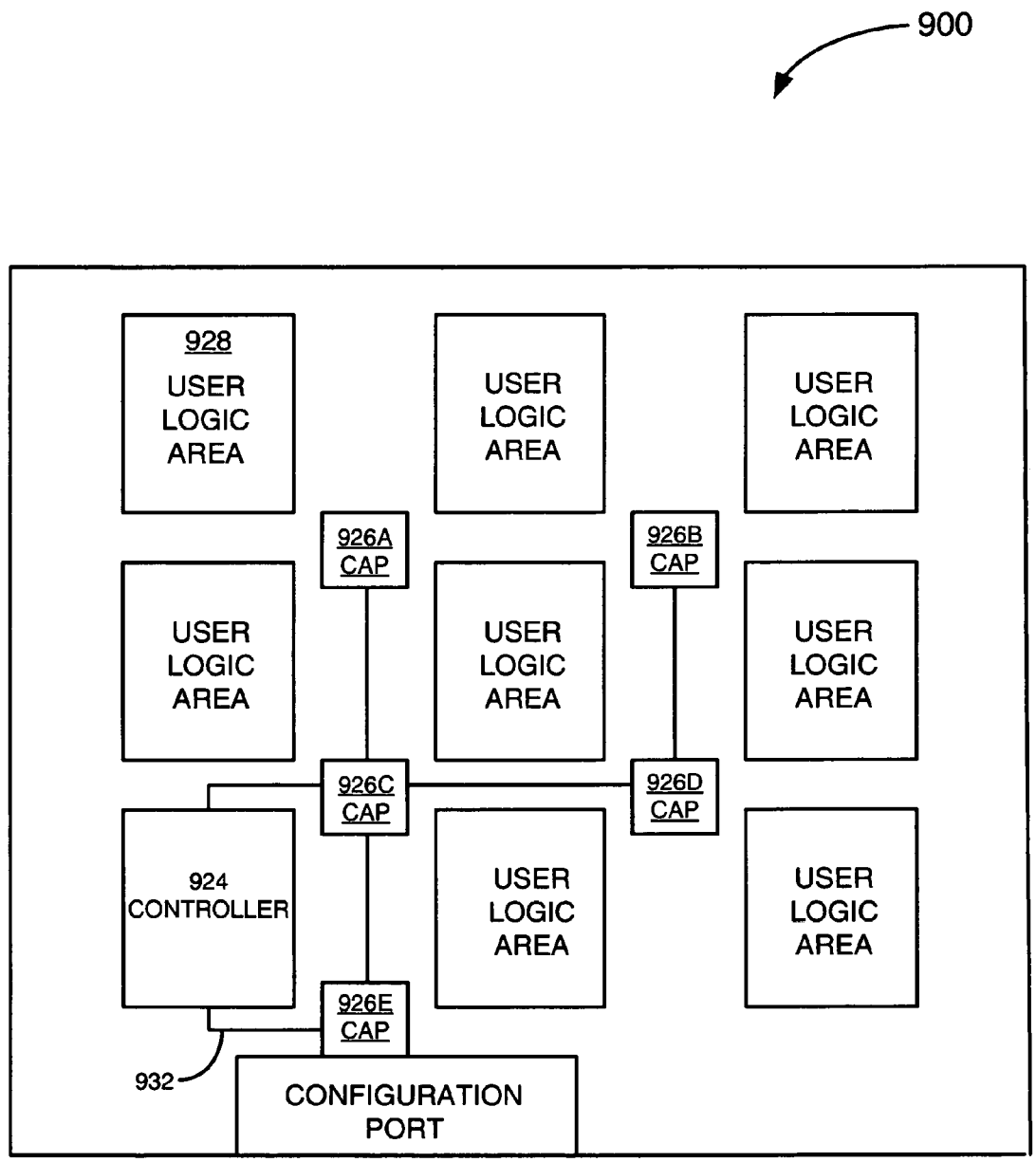
FIG. 9 is a simplified block diagram of a programmable logic device showing a network of configuration access ports interfacing a controller that may be associated with an embodiment for configuration of a programmable logic device according to a further embodiment of the present invention.

In a further embodiment, referencing FIG. 9, programmable logic device 900 may be configured with a plurality of internal configuration access ports 926A–E that may share a common programmable interconnect datapath 932 to controller 924. Although a single datapath 932 is shown for simplicity, some embodiments may comprise a plurality of datapaths 932 from a controller 924 to the internal configuration access ports 926A–E. The topology of datapaths 932 may comprise one of a ring topology, a star topology, a tree topology, a serial topology, or other routing configuration. Any of the plurality 926A–E may be associated with a portion of the boot-strap configurator, which, in turn, may need to be overwritten during the reconfiguration process. Despite the reconfiguration to be performed, some of the inherent configured provisions thereof might remain intact for enabling similar communication functionality with other user logic areas 928, such as block RAM, configurable logic blocks, local interconnects, or other devices or circuits of a given user-specified application design. Accordingly, the reconfiguration may need only replace/overwrite a portion of the boot-strap configuration data.

Further referencing FIGS. 3–4, 6–9, the programmable logic device may be programmed or comprise logic to perform the methods described with reference to FIG. 5. For example, software instructions may be stored in electronic format on a medium and operable, when executed by a controller or processor of the boot-strap configurator, to manage/perform one of the previously described methods of PLD configuration. In particular embodiments, the format of these instructions may include machine-readable code, assembly language, high-level language, or other format. Such instructions may be stored in cache memory of a processor, in block RAM, in configuration memory, in read-only nonvolatile memory, or elsewhere on or external the device.

In a particular embodiment, the logic/instructions may be executable by at least one of a processor or other logic on the programmable logic device. Depending on design considerations in a particular embodiment, such logic may refer to a variety of logic devices of the programmable logic device (e.g., microprocessor, embedded microprocessor, controller, sequencer, finite state machine, soft processor, dedicated hardwired logic, logic used in conjunction with a function look-up table within or without a programmable logic device) and operable to execute the configuration sequence.

The various embodiments described above are provided by way of illustration only and should not be construed to limit the invention. Based on the above discussion and illustrations, those skilled in the art will readily recognize that various modifications and changes may be made to the present invention without strictly following the exemplary embodiments and applications illustrated and described herein. Such modifications and changes do not depart from the true spirit and scope of the present invention as may be set forth in the following claims.

What is claimed is:

1. A method of configuring a programmable logic device, comprising:
    configuring first configurable resources of the programmable logic device as a boot-strap configurator, the configuring based on first data in a first portion of configuration memory of the programmable logic device;
    storing replacement data in the programmable logic device; and
    retrieving the replacement data stored in the programmable logic device and using the retrieved replacement data to overwrite at least a part of the first portion of the configuration memory.

2. The method of claim 1, further comprising using the boot-strap configurator to load second data into a second portion of the configuration memory; and
    configuring second configurable resources of the programmable logic device, including at least a portion of the first configurable resources, based on the second data in the second portion of the configuration memory and based on the replacement data overwritten into the first portion of the configuration memory.

3. The method of claim 1, wherein:
    the configuring the first configurable resources comprises configuring an internal configuration access port (ICAP) to enable receipt of configuration data from a ROM; and
    the obtaining the first data comprises retrieving the first data from the ROM.

4. The method of claim 1, wherein the configuring comprises configuring at least one programmable resource of the group consisting of a configurable I/O port, a configuration access port (CAP), an embedded processor, a multi-gigabit transceiver, and a serial scan interface port to be operable as a part of the boot-strap configurator to receive data including the replacement data.

5. The method of claim 4, further comprising:
    receiving the data including the replacement data; and
    processing the data received by at least one of decompression and decryption to recover the replacement data.

6. The method of claim 1, wherein the configuring comprises:
    configuring an embedded processor to be operable to receive data including the replacement data; and
    programming the embedded processor with instructions executable to perform at least one of decryption and decompression of the data received from which to obtain the replacement data.

7. The method of claim 1, wherein:
    the configuring configures at least one of a block RAM and cache of an embedded processor to be operable to buffer the replacement data; and
    the storing stores the replacement data in the at least one of the configured block RAM and the cache of the embedded processor.

8. The method of claim 7, further comprising recovering the replacement data from source data by at least one of decompression and decryption.

9. The method of claim 1, wherein the configuring configures one of an embedded processor and combinational logic as a controller within the boot-strap configurator to be operable to control the retrieving of the replacement data and the overwriting at least a part of the first portion of the configuration memory.

10. The method of claim 9, wherein the storing stores the replacement data into at least one of cache of an embedded processor and block RAM of the programmable logic device; and the retrieving and the overwriting comprise transferring the replacement data via one or more block transfers into the configuration memory from the at least one of the cache of the embedded processor and the block RAM.

11. The method of claim 10, wherein the configuring comprises enabling an internal configuration access port (ICAP) to interface the configuration memory; and the transferring the replacement data into the configuration memory is performed internally within the programmable logic device via the ICAP.

12. The method of claim 1, wherein the configuring comprises:

configuring at least one of a configurable I/O port and a multi-gigabit transceiver (MGT) as a part of the first configurable resources to be operable to receive data;

the method further comprising receiving data including the replacement data by way of the at least one of the configured configurable I/O port and MGT.

13. The method of claim 1, wherein the overwriting the at least a part of the first portion of the configuration memory comprises overwriting configuration memory associated with at least one of an I/O port and a multi-gigabit transceiver (MGT).

14. A system to configure a programmable logic device, comprising:

configuration memory to retain configuration data;

programmable resources configurable based on the configuration data in the configuration memory; and a boot-up controller operable to launch a boot-up sequence;

media accessible by the boot-up controller having data recoverable as at least a portion of the boot-up sequence and to cause the boot-up controller to:

write a first portion of the configuration memory with boot-strap configuration data to configure a boot-strap configurator; and enable the configured boot-strap configurator to:
 obtain and buffer reconfiguration data;
 obtain application data and store the application data in a second portion of the configuration memory different from the first portion;
 configure a portion of the programmable resources based on the application data; and
 retrieve the buffered reconfiguration data and overwrite at least part of the first portion of the configuration memory with the retrieved reconfiguration data and reconfigure at least a portion of resources previously defining the boot-strap configurator.

15. The system of claim 14, the boot-up sequence further to cause retrieval of at least a portion of the boot-strap configuration data from a source external the programmable logic device.

16. The system of claim 14, the boot-up sequence to configure at least one of a configuration access port, an embedded processor, and a multi-gigabit transceiver of the programmable logic device to recover the reconfiguration data and the application data.

17. The system of claim 14, further comprising an internal configuration access port (ICAP) configurable by way of the boot-strap configurator to interface the configuration memory;

at least a portion of the boot-up sequence to enable the ICAP for assisting the overwriting at least part of the first portion of the configuration memory with the retrieved reconfiguration data.

18. A computer readable medium having data with instructions to perform, when executed by at least one of a controller and a processor of a programmable logic device, a boot-up configuration method comprising:

loading first data into a first portion of configuration memory of the programmable logic device and configuring a boot-strap configurator;

loading replacement data into a buffer of the programmable logic device;

loading second data into a second portion of the configuration memory; and overwriting at least part of the first portion of configuration memory with at least a portion of the replacement data from the buffer.

19. The medium of claim 18, wherein the data with instructions is further operable to cause the at least one of the controller and the processor to clear the replacement data from the buffer.

20. The medium of claim 18, wherein the data with instructions is further operable to cause the at least one of the controller and the processor to configure one of a cache of an embedded processor and block RAM (BRAM) as the buffer of the programmable logic device.

* * * * *